（12）United States Patent
Shinonaga (10) Patent No.: US 7,580,115 B2
(45) Date of Patent: Aug. 25, 2009

(54) EXPOSURE APPARATUS AND METHOD, AND DEVICE MANUFACTURING METHOD

(75) Inventor: Hirohiko Shinonaga, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 8 days.

(21) Appl. No.: 11/682,958

(22) Filed: Mar. 7, 2007

(65) Prior Publication Data

US 2007/0211236 A1 Sep. 13, 2007

(30) Foreign Application Priority Data

Mar. 7, 2006 (JP) .............................. 2006-060912

(51) Int. Cl.
*G03B 27/54* (2006.01)
*G03B 27/42* (2006.01)
(52) U.S. Cl. .......................................... 355/67; 355/53
(58) Field of Classification Search ................... 355/30, 355/52, 53, 55, 67
See application file for complete search history.

(56) References Cited

U.S. PATENT DOCUMENTS

| | | | |
|---|---|---|---|
| 5,473,410 A | 12/1995 | Nishi | |
| 6,411,364 B1 * | 6/2002 | Suzuki | 355/53 |
| 6,462,807 B1 * | 10/2002 | Nishi | 355/53 |
| 6,995,833 B2 | 2/2006 | Kato et al. | |
| 7,064,805 B2 * | 6/2006 | Nemoto | 355/53 |
| 2005/0078286 A1 * | 4/2005 | Dierichs et al. | 355/30 |

FOREIGN PATENT DOCUMENTS

JP 2005-037896 2/2005

* cited by examiner

*Primary Examiner*—Hung Henry Nguyen
(74) *Attorney, Agent, or Firm*—Rossi, Kimms & McDowell LLP (57) ABSTRACT

An exposure apparatus for exposing a substrate by scanning a reticle and the substrate relative to each other includes a projection optical system configured to project a pattern of the reticle onto the substrate, and a field stop configured to define a slit-shaped exposure area, and to change a length of the exposure area in a scanning direction in accordance with a change of a length of the exposure area in a direction orthogonal to the scanning direction.

9 Claims, 7 Drawing Sheets

EXPOSURE APPARATUS AND METHOD, AND DEVICE MANUFACTURING METHOD

BACKGROUND OF THE INVENTION

The present invention relates to an exposure apparatus and method, and a device manufacturing method. The present invention is particularly suitable for an immersion exposure apparatus.

A projection exposure apparatus has been conventionally used to manufacture fine devices, such as a semiconductor memory and a logic circuit, using the photolithography technology. The projection exposure apparatus projects a circuit pattern of a reticle (mask) onto a wafer via a projection optical system. The current mainstream is step-and-scan exposure apparatus (scanner) that exposes by scanning the reticle and the wafer relative to each other.

As the high integration or fine processing of the semiconductor device (circuit pattern) proceeds, the demands for the specification and performance of the projection optical system become increasingly stricter. In general, use of a short wavelength of the exposure light and a high numerical aperture ("NA") scheme of the projection optical system are effective for high resolving power. For the high NA scheme, a recently proposed optical system achieves a NA of 1 or greater through the immersion lithography that fills liquid in a space between the wafer and the final optical element of the projection optical system closest to the wafer.

On the other hand, one proposed approach to use a short wavelength of the exposure light is realized through use of an ArF excimer laser (having a wavelength of about 193 nm) and a $F_2$ laser. When this type of laser is used for a light source, a usable glass material is limited to quartz and calcium fluoride ($CaF_2$) in a dioptric optical system, due to a transmittance degradation of the glass material to the exposure light. In addition, even with this type of glass material, a small dispersion difference makes very difficult a correction of a chromatic aberration in an optical system having a very high NA. Accordingly, various proposals that include a mirror in the optical system are made to avoid the problems of the transmittance and the chromatic aberration. For example, a catadioptric projection optical system that combines a reflection system and a refraction system is disclosed. See Japanese Patent Application, Publication No. ("JP") 2005-37896.

The exposure apparatus is also required to inexpensively improve the throughput or productivity. However, a large aperture glass material associated with the high NA scheme causes a cost increase. In particular, the catadioptric projection optical system has a rectangular slit shaped exposure area that does not generally contain the lens's optical axis, requiring a larger view angle than the dioptric optical system. Thereby, a large aperture of the lens diameter is likely to increase the cost. Moreover, the large aperture of the lens's diameter makes difficult or unavailable the aberrational correction or the so-called lens design itself in addition to the cost increase.

For the improvement of the productivity, one exposure apparatus preferably exposes a wide variety of semiconductor devices, or differently sized chips. Accordingly, the conventional scanner includes a large aperture lens in the projection optical system, makes the longitudinal direction of the exposure area (orthogonal to the scanning direction) variable for various sized chips. However, as described above, the large aperture lens causes a cost increase, and the accumulated exposure dose in the exposure area maintains even when the length in the longitudinal direction is made variable. Hence, a time period necessary to expose one chip or shot on the wafer (that is a substrate to be exposed) is always constant. In other words, the conventional scanner maintains the exposure time period whether exposing a small sized chip or a large sized chip.

SUMMARY OF THE INVENTION

The present invention is directed to an exposure apparatus and method that can expose differently sized chips, and inexpensively shorten a time period necessary to expose a small sized chip on a wafer.

An exposure apparatus according to one aspect of the present invention for exposing a substrate by scanning a reticle and the substrate relative to each other includes a projection optical system configured to project a pattern of the reticle onto the substrate, and a field stop configured to define a slit-shaped exposure area, and to change a length of the exposure area in a scanning direction in accordance with a change of a length of the exposure area in a direction orthogonal to the scanning direction.

An exposure method according to another aspect of the present invention for exposing a reticle pattern onto a substrate includes the steps of defining a slit-shaped exposure area, and scanning the reticle and the substrate relative to each other after defining the exposure area, wherein said defining step includes a first determining step of determining a length in a direction orthogonal to the scanning direction, and a second determining step of determining a length in the scanning direction in accordance with a length in the direction orthogonal to the scanning direction determined by the first determining step.

A device manufacturing method according to still another aspect of the present invention includes the steps of exposing a substrate using the above exposure apparatus, and developing the substrate that has been exposed.

A further object and other characteristics of the present invention will be made clear by the preferred embodiments described below referring to accompanying drawings.

DESCRIPTION OF THE EMBODIMENTS

Referring now to the accompanying drawings, a description will be given of an exposure apparatus according to one aspect of the present invention. In each figure, the same reference numeral designates the same element, and a duplicate description thereof will be omitted. Here, FIG. 1 is a schematic sectional view showing a structure of the exposure apparatus 1 according to one aspect of the present invention.

The exposure apparatus 1 is an immersion exposure apparatus that exposes a pattern of a reticle 20 onto a wafer 40 via liquid L that is supplied to a space between the wafer 40 and a final optical element of the projection optical system 30, which is closest to the wafer 40 among the optical elements in the projection optical system 30. The exposure apparatus 1 of this embodiment uses a step-and-scan exposure manner to expose the wafer 40. However, the present invention is applicable to a step-and-repeat exposure apparatus.

Figure 1:
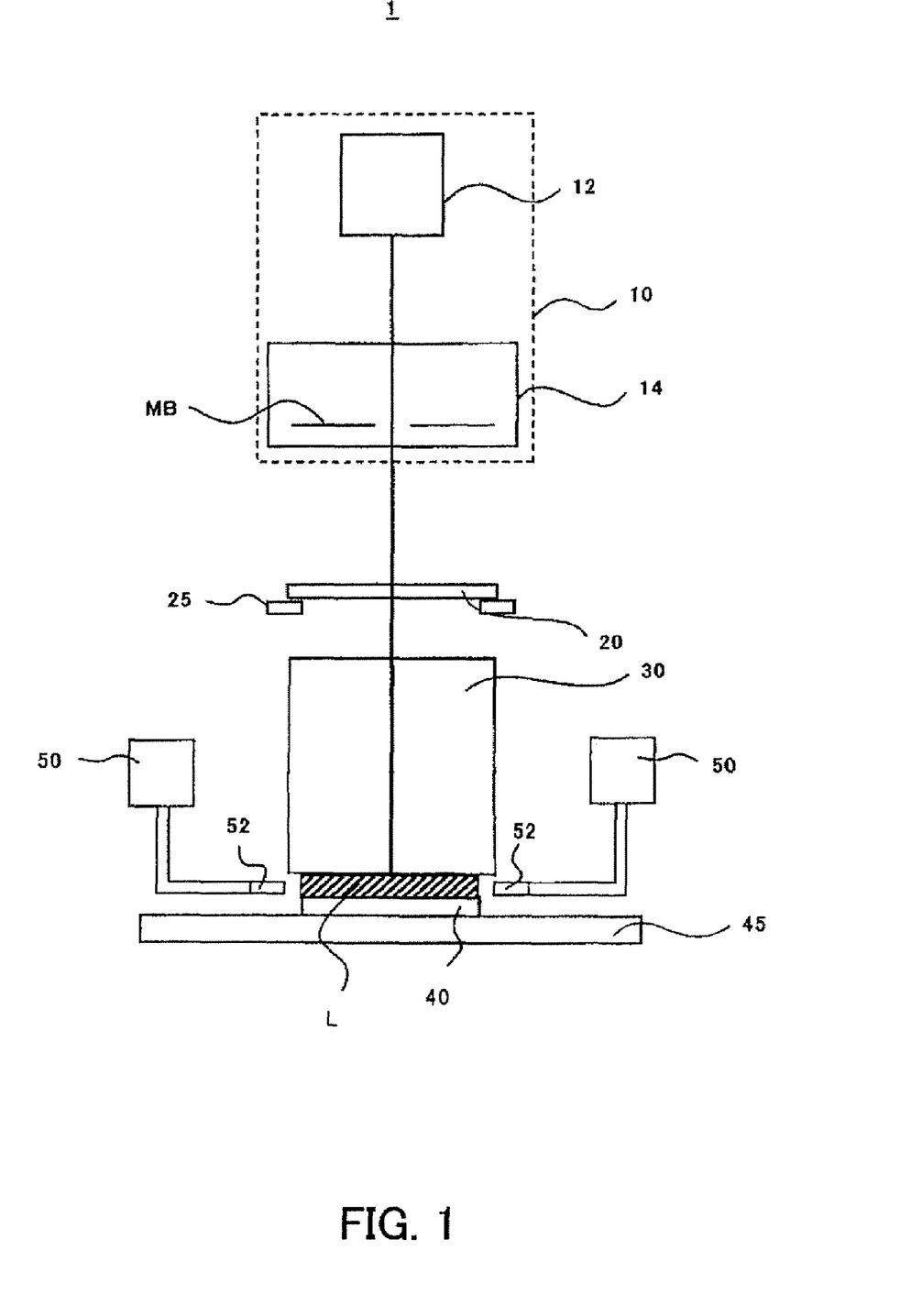
FIG. 1 is a schematic sectional view of a structure of an exposure apparatus according to one aspect of the present invention.

The exposure apparatus 1 includes, as shown in FIG. 1, an illumination apparatus 10, a reticle stage 25 mounted with a reticle 20, a projection optical system 30, a wafer stage 45 mounted with a wafer 40, a liquid supply/recovery mechanism 50, and a controller (not shown).

The illumination apparatus 10 illuminates the reticle 20, on which a circuit pattern to be transferred is formed, and includes a light source 12, and an illumination optical system 14.

The light source 12 uses an ArF excimer laser with a wavelength of approximately 193 nm, but may use an $F_2$ laser with a wavelength of approximately 157 nm, and an extreme ultraviolet ("EUV") light source having a wavelength between 10 nm and 15 nm. One or more lamps, such as a mercury lamp and a xenon lamp, may also be used.

The illumination optical system 14 is an optical system that illuminates the reticle 20, and includes a lens, a mirror, an optical integrator, and a stop. The illumination optical system 14 can use the light whether it is axial or non-axial.

The illumination optical system 14 includes a masking blade MG as a field stop at a position optically conjugate with the reticle 20. The masking blade MB restricts an illumination range illuminated by the illumination apparatus 10, and defines the exposure area. The exposure area has a slit shape in this embodiment with variable the lengths both in the scanning direction and the direction orthogonal to the scanning direction of each of the reticle 20 and the wafer 40.

Figure 2:
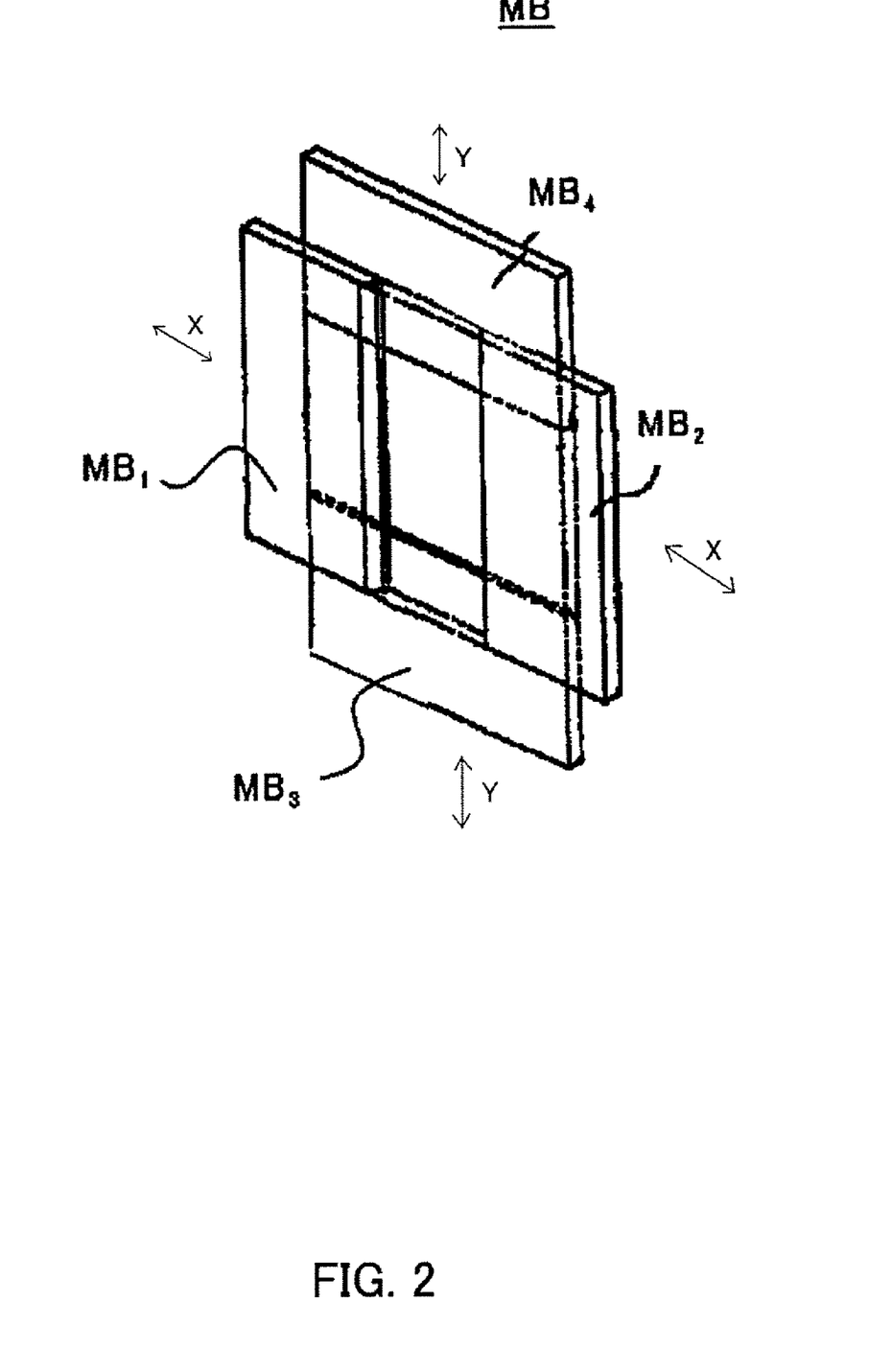
FIG. 2 is a schematic perspective view of a concrete structure of a masking blade in the exposure apparatus shown in FIG. 1.

FIG. 2 is a schematic perspective view showing a concrete structure of the masking blade MB. The masking blade MB has X direction blades $MB_1$ and $MB_2$, and Y direction blades $MB_3$ and $MB_4$, and the light passes through an opening formed by these blades $MB_1$ to $MB_4$, forming the slit-shaped exposure area.

The X direction blades $MB_1$ and $MB_2$ are arranged on the same plane, and are movable in the X direction or the direction orthogonal to the scanning direction. Similarly, the Y direction blades $MB_3$ and $MB_4$ are arranged on the same plane, and are movable in the Y direction or the scanning direction. When X direction blades $MB_1$ and $MB_2$, and Y direction blades $MB_3$ and $MB_4$ are moved, the lengths vary both in the scanning direction and the direction orthogonal to the scanning direction.

Figure 3:
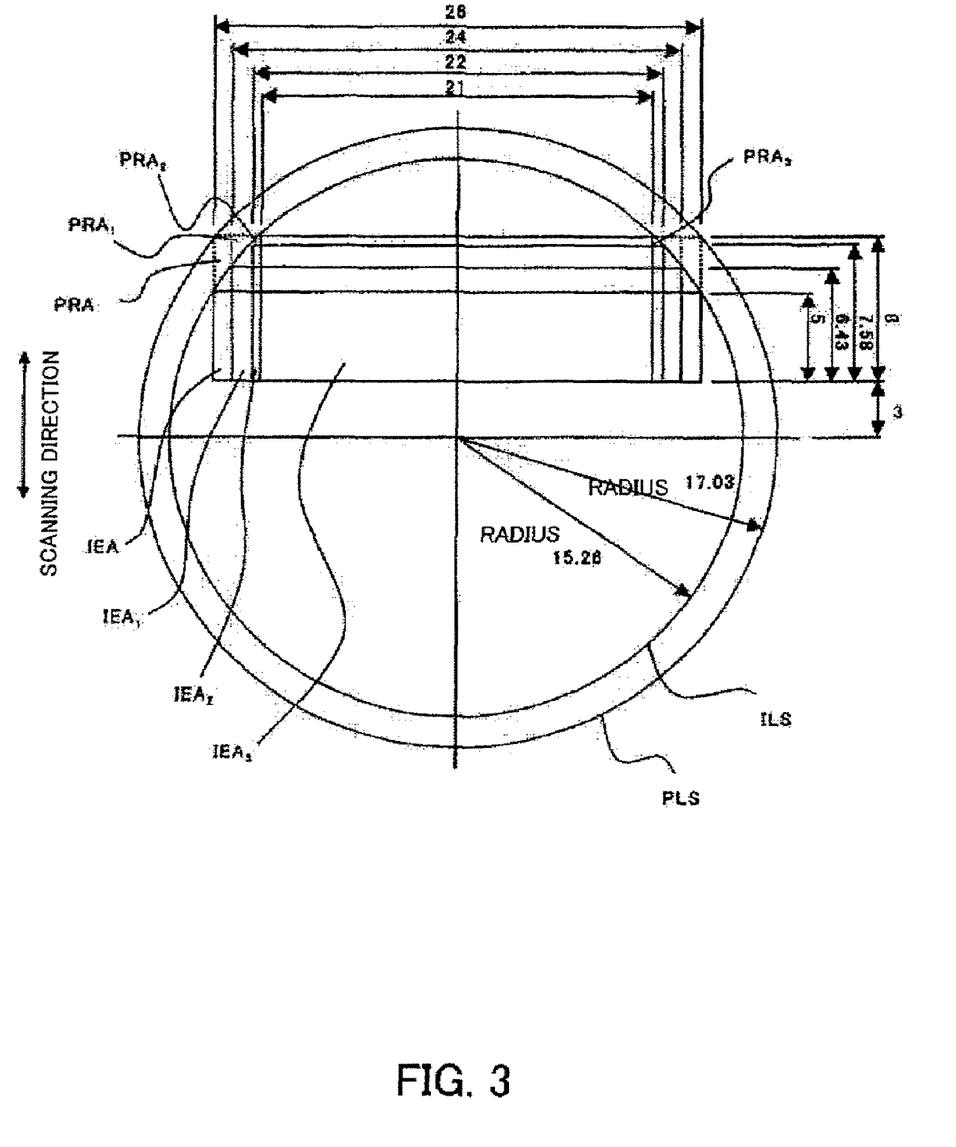
FIG. 3 is a view for explaining a relationship between a designed area of the projection optical system and the slit-shaped exposure area defined by the masking blade in the exposure apparatus shown in FIG. 1.

Referring now to FIG. 3, a description will be given of a relationship between the slit-shaped exposure area defined by the masking blade MB and the designed area of the projection optical system 30.

The projection optical system 30 of this embodiment is a so-called catadioptric system that includes a mirror. The making blade MB needs to define an exposure area that does not contain the lens's optical axis in the projection optical system 30 in order to separate the reflected light.

Prior art define an exposure area PRA with a length of 26 mm in the direction perpendicular to the scanning direction, and a length of 8 mm in the scanning direction, for example, when the exposure area has a central coordinate (x, y) of (0, 7). The conventional exposure area PRA makes variable the length only in the direction perpendicular to the scanning direction. The conventional exposure area PRA fixes the length in the scanning direction of 8 mm, and varies the length in the direction perpendicular to the scanning direction in exposing a differently sized chip.

For example, the exposure area PRA is turned into an exposure area $PRA_1$ having a length of 24 mm in the direction perpendicular to the scanning direction, an exposure area $PRA_2$ having a length of 22 mm in the direction perpendicular to the scanning direction, and an exposure area $PRA_3$ having a length of 21 mm in the direction perpendicular to the scanning direction. Therefore, the projection optical system has a designed maximum view-angle radius of 17.03 mm, and requires a lens PLS whose aberration is well corrected in a radius range between 3 mm and 17.03 mm. Such a large aperture lens has design difficulties, causing a cost increase. In addition, as a chip size reduces, the exposure area PRA becomes small, and the accumulated exposure dose is always constant. Therefore, the time period necessary to expose one chip or shot on the wafer 40 maintains whether the exposure apparatus exposes a large sized chip or a small sized chip.

On the other hand, the present invention sets the central coordinate (x, y) of the exposure area to (0, 5.5), and defines an exposure area IEA that has a length of 26 mm in the direction perpendicular to the scanning direction, and a length of 5 mm in the scanning direction. The inventive exposure area IEA makes variable the lengths both in the scanning direction and the direction perpendicular to the scanning direction, and thus varies both of these lengths in exposing a differently sized chip.

For example, the exposure area IEA is turned into an exposure area $IEA_1$ having a length of 24 mm in the direction perpendicular to the scanning direction and a length of 6.43 mm in the scanning direction, an exposure area $IEA_2$ having a length of 22 mm in the direction perpendicular to the scanning direction and a length of 7.58 mm in the scanning direction, and an exposure area $IEA_4$ having a length of 21 mm in the direction perpendicular to the scanning direction and a length of 8 mm in the scanning direction. Therefore, the projection optical system 30 has a designed maximum view-angle radius of 15.26 mm, and requires a lens whose aberration is well corrected in a radius range between 3 mm and 15.26 mm. The maximum view-angle radius of the lens ILS can be made smaller by 10% or greater than the designed maximum view-angle radius of 17.03 mm of the conventional lens PLS. This configuration facilitates a lens design of the projection optical system 30, and enables the aberration to be well corrected, consequently remarkably improving the imaging characteristic, and preventing the large aperture lens and a cost increase. Moreover, as a chip size reduces, the exposure area IEA increases with the accumulated exposure dose, thus shortening a time period necessary to expose one chip on the wafer 40 in exposing a small sized chip. In defining the exposure area IEA, the length in the direction perpendicular to the scanning direction is set in accordance with the exposed chip size, and the largest available length in the scanning direction is set in accordance with the length. In other words, the defined exposure area IEA has a maximum effective diameter of the lens in the projection optical system 30, improving the productivity better than the conventional exposure apparatus.

Turning back to FIG. 1, the reticle 20 is made, for example, of quartz, has a circuit pattern to be transferred, and is supported and driven by the reticle stage 25. The reticle stage 25 supports the reticle 20, and is connected to a moving mechanism (not shown).

The projection optical system 30 projects a pattern of the reticle 20 onto the wafer 40. The projection optical system 30 of this embodiment is a catadioptric system having at least one mirror, and a very high NA of 0.8 or greater, preferably 0.85 or greater.

Figure 4:
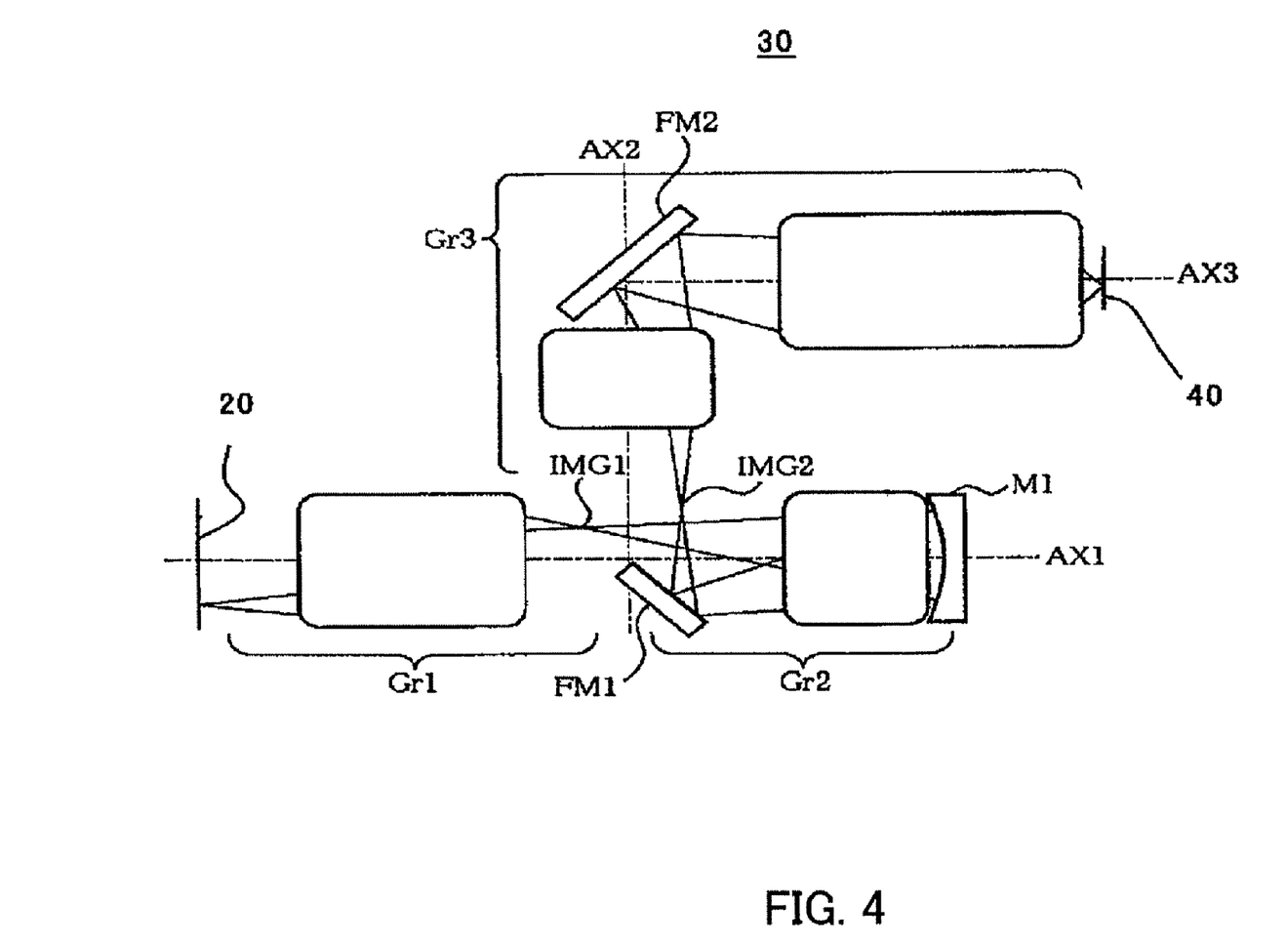
FIG. 4 is a schematic sectional view showing one illustrative structure of the projection optical system in the exposure apparatus shown in FIG. 1.

FIG. 4 is a schematic sectional view showing one illustrative structure of the projection optical system 30. In FIG. 4, AX1 to AX3 denote optical axes in the optical system. The projection optical system 30 includes, in order from the reticle 20 side along the optical path, a first imaging optical system Gr1, a second imaging optical system Gr2, and a third imaging optical system Gr3.

The first imaging optical system Gr1 forms a pattern image of the reticle 20 or a first intermediate image IMG1). The second imaging optical system Gr2 forms an image of the first intermediate image IMG1 or a second intermediate image IMG2, and has a concave mirror M1. The third imaging optical system Gr3 forms an image of the second intermediate image IMG2 onto the wafer 40.

The projection optical system 30 has a pair of (i.e., first and second) flat mirrors FM1 and FM2. One flat mirror FM1 is arranged between the second imaging optical system Gr2 and the third imaging optical system Gr3, and the other flat mirror FM2 is arranged in the third imaging optical system Gr3.

This embodiment uses an off-axis area distant from the optical axis AX1 to transfer the light emitted from the image height of the reticle 20 onto the wafer 40, as shown in FIG. 4. A pattern of the slit-shaped (exposure) area of the reticle 20 that does not contain the optical axis AX2 is projected onto the wafer 40.

Figure 5:
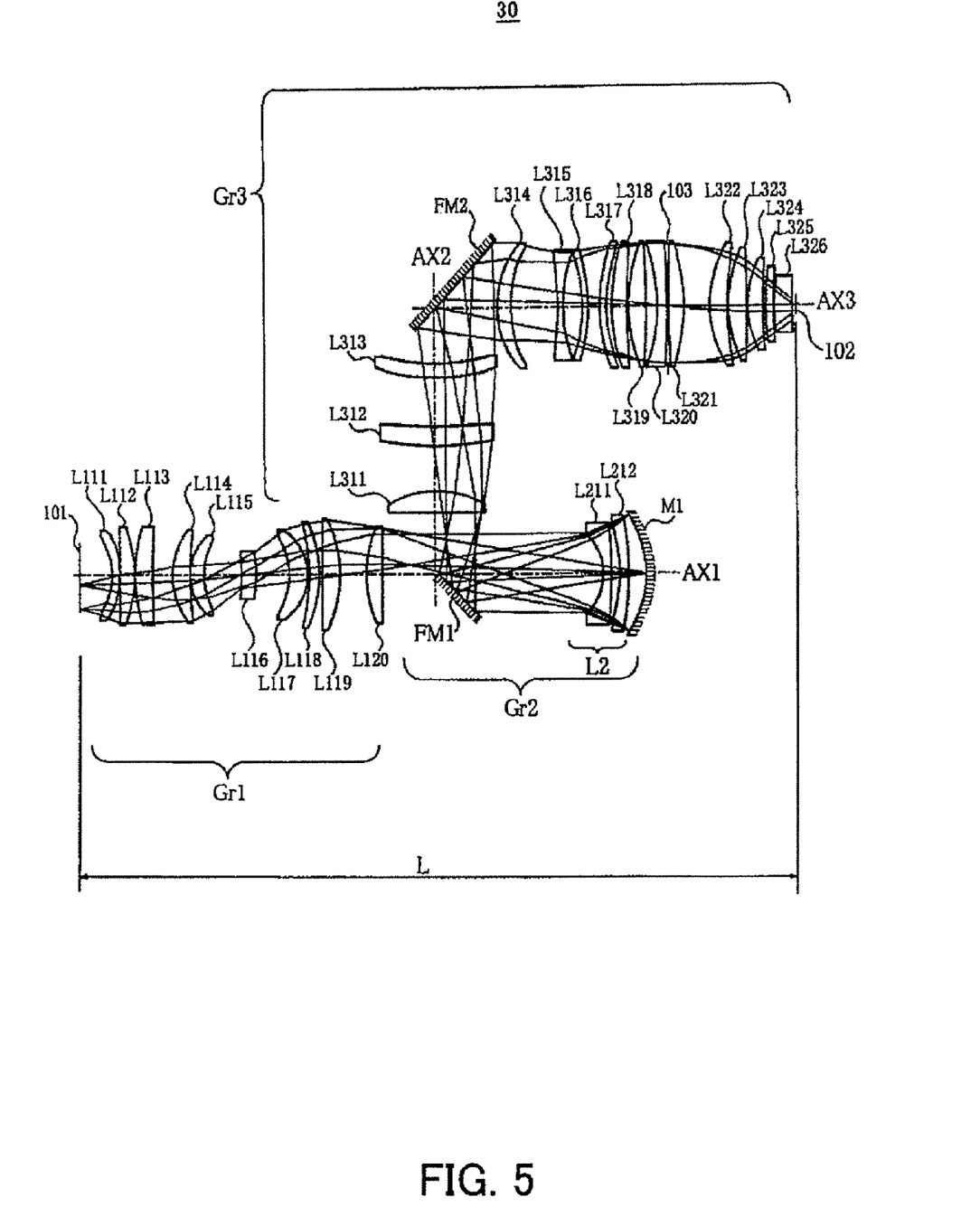
FIG. 5 is an optical path diagram showing a concrete lens structure of the projection optical system shown in FIG. 4.

FIG. 5 is an optical path diagram of a concrete lens structure of the projection optical system 30. The projection optical system 30 shown in FIG. 5 has a projection magnification of ¼ times and a reference wavelength of 193 nm, and is made of quartz as a glass material. Its NA is 1.20 at the image side, and a distance L of 1663.38 mm between the object and the image (i.e., from the reticle 20 to the wafer 40). Since each imaging optical system and the structure and function of each lens unit are described in JP2005-37896 assigned to the same assignee, a detailed description thereof will be omitted.

The aberration is well corrected in the view-angle radius range between 3 mm and 15.26 mm. The projection optical system 30 secures a rectangular exposure area with variable lengths in both the scanning direction and the direction perpendicular to the scanning direction. The rectangular exposure area is defined by the length in the direction perpendicular to the scanning direction times the length in the scanning direction, such as 26 mm×5 mm, 24 mm×6.43 mm, 22 mm×7.58 mm, and 21 mm×8 mm.

A photoresist is applied to the surface of the wafer 40. This embodiment uses a wafer for the substrate, but the substrate may use a liquid crystal substrate, a glass plate, and another substrate instead of the wafer 40.

The wafer stage 45 supports the wafer 40, and is connected to a moving mechanism (not shown).

The liquid supply/recovery mechanism 50 supplies the liquid L to the space between the final lens of the projection optical system 30 and the wafer 40 and recovers the supplied liquid L via a supply/recovery nozzle 52. Therefore, a gap between the final lens of the projection optical system 30 and the wafer 40 is filled with the liquid L supplied from the liquid supply/recovery mechanism 50. The liquid L is, but not limited to, pure water in this embodiment.

A controller (not shown) has a CPU and a memory, and controls the illumination apparatus 10, the reticle stage 25, the wafer stage 45, and the liquid supply/recovery mechanism 50. The controller of this embodiment controls an exposure area based on a chip size via the masking blade MB in the illumination optical system 14. The controller serves to control switching among supply, recovery, and stop of the liquid L, the supply amount of the liquid based on a condition including the driving direction of the wafer stage 45 during exposure.

In operation of the exposure apparatus 1, the reticle 20 and the wafer 40 are mounted on the reticle stage 25 and the wafer stage 45, respectively. After the reticle 20 and the wafer 40 are mounted, the masking blade MB and the controller define the slit-shaped exposure area in accordance with the chip size of the wafer 40. More specifically, the controller moves the Y direction blades $MB_3$ and $MB_4$ so as to make a length equal to the length of the wafer 40 in the direction perpendicular to the scanning direction on so as to determine the length of the exposure area in that direction. Next, in accordance with the length in that direction, the controller moves the X direction blades $MB_1$ and $MB_2$ so as to determine the length of the exposure area in the scanning direction. In that case, the controller preferably determines the length in the scanning direction so as to maximize the effective diameter of the lens in the projection optical system 30 or to maximize the length in the scanning direction. This configuration maximizes the exposure area, and increases the accumulated exposure dose, shortening a time period necessary to expose one chip on the wafer 40 in exposing a smaller sized chip. After the masking blade MB defines the exposure area, the pattern of the reticle 20 is exposed onto the wafer 40 by scanning the reticle 20 and the wafer 40 relative to each other.

Thus, the exposure apparatus 1 can expose a wide variety of semiconductor devices through a variable exposure area defined by the masking blade MB. In addition, the large aperture of the lens in the projection optical system 30 and the increased cost are prevented. Moreover, the exposure apparatus 1 can increase the accumulated exposure dose in exposing a small sized chip, and shorten a time period necessary to expose one chip on the wafer 40. Moreover, the aberration of the projection optical system 30 is well corrected, and it exhibits a superior exposure characteristic. Therefore, the exposure apparatus 1 can provide higher quality devices than ever, such as semiconductor devices and LCD devices, with high economic efficiency.

Figure 6:
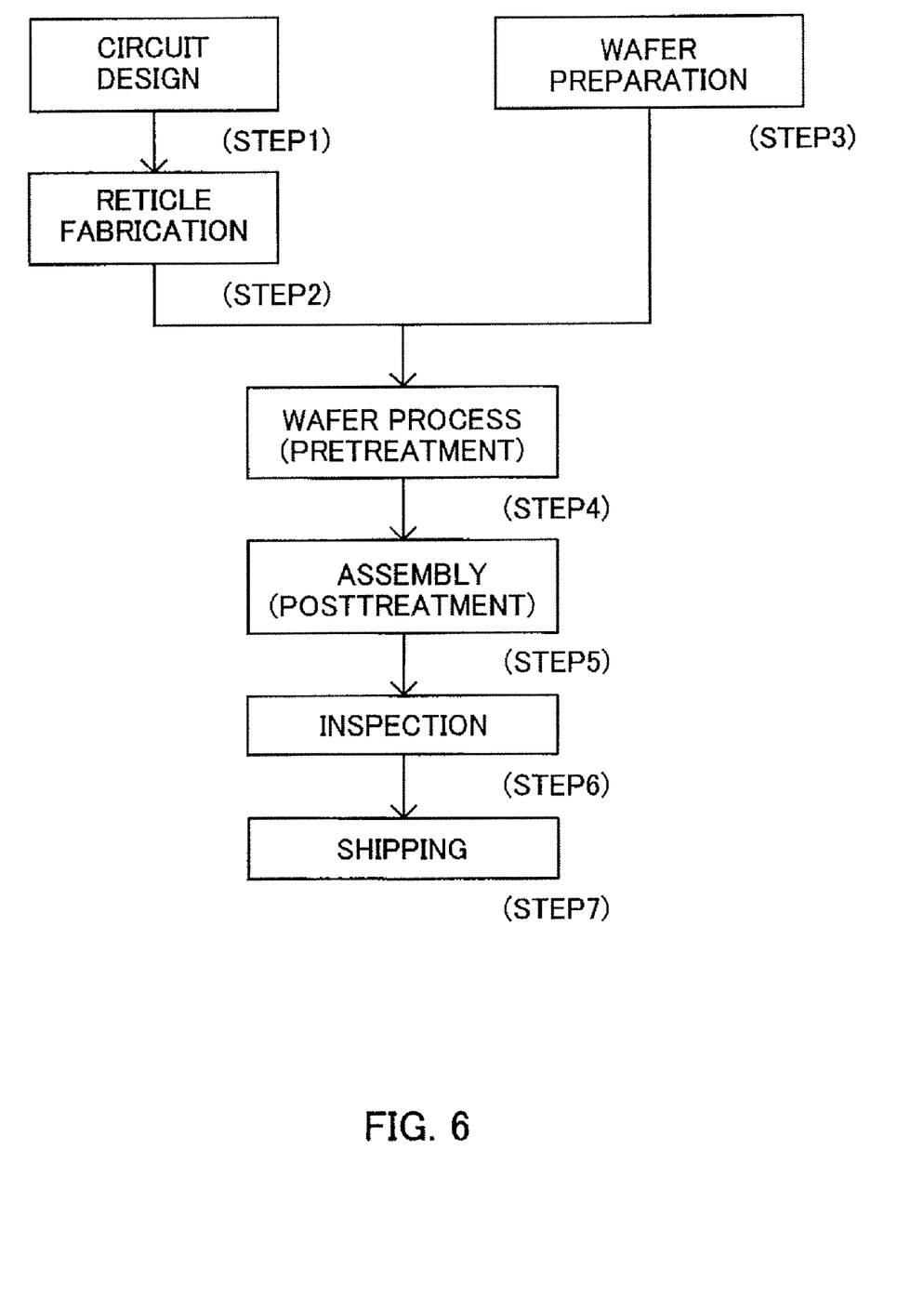
FIG. 6 is a flowchart for explaining a manufacture of a device.
Figure 7:
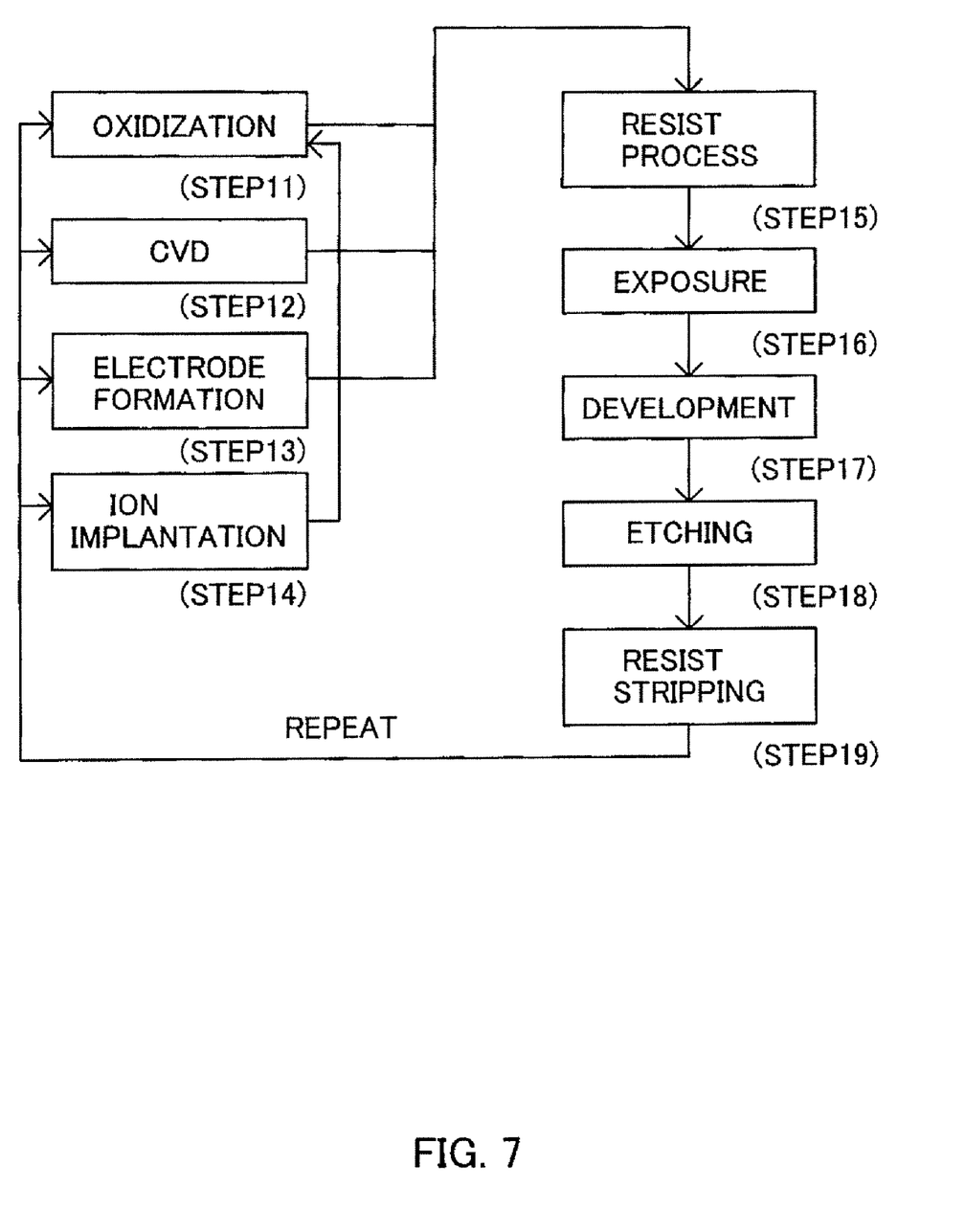
FIG. 7 is a flowchart for a wafer process of step 4 shown in FIG. 6.

Referring now to FIGS. 6 and 7, a description will be given of an embodiment of a device manufacturing method using the exposure apparatus 1. FIG. 6 is a flowchart for explaining how to fabricate devices, such as a semiconductor device and a LCD device. Here, a description will be given of the fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 7 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation)

implants ions into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the above device manufacturing method can provide a higher quality device than ever. Thus, the device manufacturing method using the exposure apparatus 1, and resultant devices constitute one aspect of the present invention.

As many apparently widely different embodiments of the present invention can be made without departing from the sprit and scope thereof, it is to be understood that the invention is not limited to the specific embodiments thereof except as defined in the claims. For example, the present invention is applicable to a non-immersion exposure apparatus, and an optical apparatus that requires a high NA optical system in addition to the catadioptric system.

The entire disclosure of Japanese Patent Application No. 2006-060912, filed on Mar. 7, 2006, including claims, specification, drawings and abstract incorporated herein by reference in its entirety.

What is claimed:

1. An exposure apparatus for exposing a substrate by scanning a reticle and the substrate relative to each other, said exposure apparatus comprising:
   a projection optical system configured to project a pattern of the reticle onto the substrate; and
   a field stop configured to define a slit-shaped exposure area, and to change a length of the exposure area in a scanning direction in accordance with a change of a length of the exposure area in a direction orthogonal to the scanning direction,
   wherein, with regard to said field stop, when the length of the exposure area in the direction orthogonal to the scanning direction is lengthened, the length of the exposure area in the scanning direction is shortened, and
   wherein, with regard to said field stop, when the length of the exposure area in the direction orthogonal to the scanning direction is shortened, the length of the exposure area in the scanning direction is lengthened.

2. An exposure apparatus according to claim 1, wherein the field stop sets the length of the exposure area in the direction orthogonal to the scanning direction so that a maximum view-angle radius of the projection optical system can reduce by 10% or greater.

3. An exposure apparatus according to claim 1, wherein the field stop changes the length of the exposure area in the scanning direction to a maximum available length of the exposure area.

4. An exposure apparatus according to claim 1, wherein the projection optical system is a catadioptric system.

5. An exposure apparatus according to claim 1, further comprising a liquid supply/recovery mechanism configured to supply liquid to a space between the projection optical system and the substrate and to recover the liquid that has been supplied.

6. An exposure method for exposing a reticle pattern onto a substrate, said exposure method comprising:
   defining a slit-shaped exposure area; and
   scanning the reticle and the substrate relative to each other after defining the exposure area,
   wherein said defining includes:
   changing a length of the exposure area in a direction orthogonal to the scanning direction; and
   changing a length of the exposure area in the scanning direction in accordance with the length in the direction orthogonal to the scanning direction,
   wherein when said changing the length of the exposure area in the direction orthogonal to the scanning direction lengthens the length of the exposure area in the direction orthogonal to the scanning direction, said changing the length of the exposure area in the scanning direction shortens the length of the exposure area in the scanning direction, and
   wherein when said changing the length of the exposure area in the direction orthogonal to the scanning direction shortens the length of the exposure area in the direction orthogonal to the scanning direction, said changing the length of the exposure area in the scanning direction lengthens the length of the exposure area in the scanning direction.

7. A device manufacturing method comprising:
   exposing a substrate using an exposure apparatus for exposing a substrate by scanning a reticle and the substrate relative to each other; and
   developing the substrate that has been exposed,
   wherein said exposure apparatus comprises:
   a projection optical system configured to project a pattern of the reticle onto the substrate; and
   a field stop configured to define a slit-shaped exposure area, and to change a length of the exposure area in a scanning direction in accordance with a change of a length of the exposure area in a direction orthogonal to the scanning direction,
   wherein, with regard to said field stop, when the length of the exposure area in the direction orthogonal to the scanning direction is lengthened, the length of the exposure area in the scanning direction is shortened, and
   wherein, with regard to said field stop, when the length of the exposure area in the direction orthogonal to the scanning direction is shortened, the length of the exposure area in the scanning direction is lengthened.

8. An exposure apparatus according to claim 1, wherein the length of the exposure area in the scanning direction is changed so that the exposure area always contacts the outer circumference of an annular zone in which an aberration of the projection optical system is corrected.

9. An exposure apparatus according to claim 1, wherein the exposure area has a rectangular shape.

* * * * *